US006586887B1

(12) United States Patent
Oogoshi et al.

(10) Patent No.: US 6,586,887 B1
(45) Date of Patent: Jul. 1, 2003

(54) HIGH-FREQUENCY POWER SUPPLY APPARATUS FOR PLASMA GENERATION APPARATUS

(75) Inventors: Yasuo Oogoshi, Kudamatsu (JP); Youji Takahashi, Kudamatsu (JP); Tadamitsu Kanekiyo, Kudamatsu (JP); Tsuyoshi Umemoto, Yamato (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/090,757

(22) Filed: Mar. 6, 2002

(51) Int. Cl.[7] .......................... H01J 7/24; B01D 59/44; B23K 9/00
(52) U.S. Cl. ..................... 315/111.41; 315/111.21; 315/502; 315/307; 250/291; 250/285; 250/300; 219/121.57
(58) Field of Search ................. 315/111.41, 111.21, 315/111.61, 291, 307, 500, 501, 502; 250/291, 285, 300, 286, 290, 294–299; 219/121.57, 121.54, 121.52

(56) References Cited

U.S. PATENT DOCUMENTS 5,841,237 A * 11/1998 Alton .................... 315/111.81
6,225,593 B1 * 5/2001 Howieson et al. ...... 219/121.57
6,472,822 B1 * 10/2002 Chen et al. ............. 315/111.21

* cited by examiner

*Primary Examiner*—Don Wong
*Assistant Examiner*—Tuyet T. Vo
(74) *Attorney, Agent, or Firm*—Antonelli, Terry, Stout & Kraus, LLP

(57) ABSTRACT

A high-frequency power supply apparatus for a plasma generation apparatus having a modulator for generating an intermittent high-frequency output on the basis of a modulation reference signal and a peak value setting signal, the high-frequency power supply apparatus having: a first control loop for comparing the peak value of the intermittent high-frequency output detected by a peak value detector with a preset peak value of the high-frequency output so that the output controller controls the peak value of the high-frequency output to be the preset peak value; and a second control loop for calculating an average value of the intermittent high-frequency output based on the preset peak setting value and a preset duty ratio setting value and generating a modulation reference signal for controlling the modulator on the basis of the average value of the high-frequency output detected by a monitor and the average value of the high-frequency output.

8 Claims, 8 Drawing Sheets

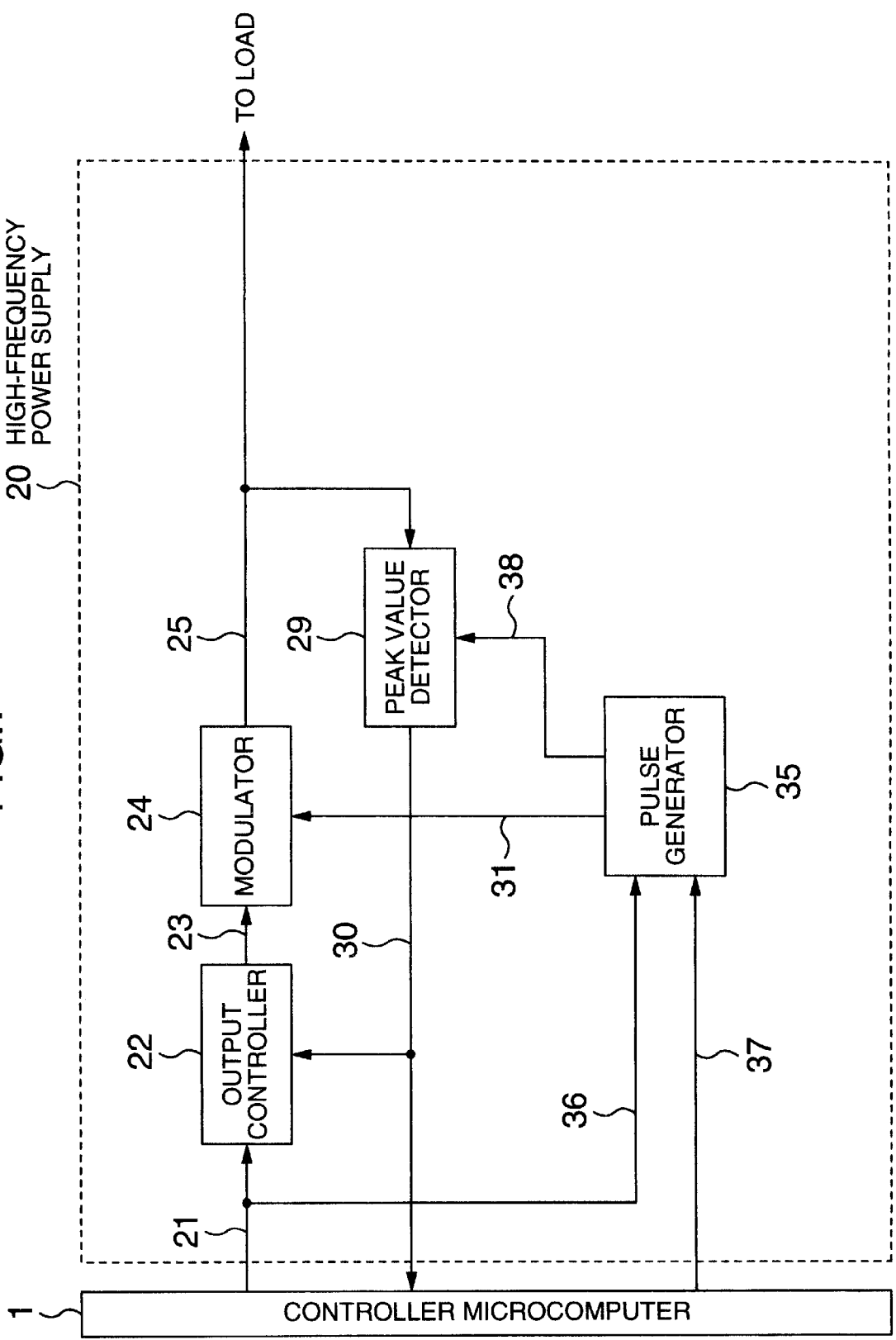

HIGH-FREQUENCY POWER SUPPLY APPARATUS FOR PLASMA GENERATION APPARATUS

BACKGROUND OF THE INVENTION

The present invention relates to a high-frequency power supply apparatus for a plasma generation apparatus, and particularly to a high-frequency power supply apparatus for a plasma generation apparatus in which the output of the power supply apparatus can be made intermittent so as to make the average output of the power supply under control.

First, a background art will be described on a plasma processing apparatus called an ECR (Electronic Cyclotron Resonance) system by way of example.

In the plasma processing apparatus of the ECR system, a microwave is introduced into a vacuum vessel to which a magnetic field is applied from the outside so as to generate plasma. Electrons make cyclotron motion due to the magnetic field. If the frequency of the cyclotron motion and the frequency of the microwave are made resonant with each other, it is possible to generate plasma efficiently. In order to accelerate ions entering a sample (or wafer), a high-frequency voltage is applied to the sample. As a gas for generating plasma, a halogen gas such as chlorine or fluorine is used.

In such a plasma processing apparatus, the output of the high-frequency power supply apparatus to be applied to the sample (wafer) is subject to ON/OFF control so that the output of the high-frequency power supply apparatus is controlled for the purpose of improvement in accuracy of finishing. By such control, the selection ratio of silicon (Si) which is a substance to be etched to a foundation oxidation film can be made high and the aspect-ratio dependence can be reduced.

Further, the output of the high-frequency power supply apparatus to be applied to a wafer is subject to ON/OFF control so that it becomes possible to reduce ablation of a sample table without lowering the wafer processing speed. Accordingly, the frequency of maintenance for sample table exchange can be reduced and the throughput of the apparatus can be improved.

FIG. 6 is a drawing for explaining the relation between the average output and the peak output value. In FIG. 6, the output of the high-frequency power supply apparatus has a waveform 141. Further, the high-frequency power supply apparatus has an ON-time 144 and an OFF-time 145 for a pulse output, and has a peak output value 142 and an average output 143. For example, when polysilicon is subject to etching, the electric power ranging from 10 W to 100 W is supplied as an average output.

Further, the duty ratio (ON-time ratio), which is a typical one for use in the ON-OFF control, is about 20%, and the average output of the high-frequency power supply apparatus is about 40 W when the peak output value of the high-frequency power supply apparatus is 200 W.

FIG. 7 is a diagram showing a high-frequency power supply apparatus for a plasma generation apparatus in the background art. In FIG. 7, there are provided: a controller microcomputer 1 for operating the high-frequency power supply apparatus; a high-frequency power supply apparatus (hereinafter simply referred to as "high-frequency power supply") 20 for a plasma generation apparatus; a peak value setting signal 21 for setting a peak value of the output of the high-frequency power supply; a repetition frequency setting signal 36 for setting the repetition frequency of ON-OFF control; an ON-time interval setting signal 37 for setting the ON-time interval when ON-OFF control is carried out; an output controller 22 for generating an operation signal 23 for operating the output peak on the basis of the peak value setting signal 21 and a fed-back peak value detection signal 30; a modulator 24 for generating a high-frequency output 25 which is made intermittent on the basis of the operation signal 23 and a modulation reference signal 31 which will be described later; a peak value detector 29 for detecting the above-mentioned intermittent high-frequency output at the timing of a pulse reference signal 38; and a pulse generator 35 for generating the modulation reference signal 31 and the pulse reference signal 38 on the basis of a repetition frequency setting signal and the ON-time interval setting signal 37 supplied from the controller microcomputer 1. The pulse generator 35 generates a rectangular wave, with a predetermined duty ratio, on the basis of the signals indicating the above-mentioned repetition frequency and the ON-time interval. The pulse generator 35 outputs the rectangular wave as the pulse reference signal 38, and further outputs, as the modulation reference signal 31, a signal obtained by multiplying the pulse reference signal 38 by a high-frequency reference signal (output of an oscillator).

First, the peak value setting signal 21 is set by the controller microcomputer 1. On the basis of the peak value setting signal 21 and the peak value signal 30 detected by the peak value detector 29, the output controller 22 outputs the operation signal 23 for controlling the peak value of the output of the high-frequency power supply 20. The modulator 24 generates intermittent high-frequency output 25 on the basis of the operation signal 23 and the modulation reference signal 31 generated in the pulse generator 35. The peak value detector 29 detects the high-frequency output which is intermittent at the timing at which the pulse reference signal 38 is supplied. By this arrangement, the detector 29 can detect the peak value of the high-frequency output (the peak output value in the ON-period of the intermittent high-frequency output). The pulse generator 35 generates a rectangular wave, with a predetermined duty ratio, on the basis of the signal 36 indicating the repetition frequency and the signal 37 indicating the ON-time interval. The rectangular wave is supplied, as the pulse reference signal 38, to the peak value detector 29 so as to be used as timing information for detecting the peak value. Further, the pulse generator 35 generates, as the modulation reference signal 31, a signal which is intermittent at the same timing as the pulse reference signal 38, and supplies this signal 31 to the modulator 24. On the basis of the peak value operation signal 23 and the modulation reference signal 31, the modulator 24 generates the high-frequency output 25 having a peak value indicated by the peak value operation signal and having duty ratio and the repetition frequency indicated by the modulation reference signal.

SUMMARY OF THE INVENTION

The average value of the above-mentioned intermittent high-frequency output can be calculated by multiplying the peak value detected by the peak value detector by the duty ratio (ON-period/ON-period+OFF-period). That is, if the peak value detected by the peak value detector, the repetition frequency setting signal and the ON-period setting signal are monitored, a high-frequency output at a desired average value can be supplied to the load.

However, the real output waveform (pulse waveform) of the high-frequency output subjected to intermittent control may generate distortion in the rectangular wave. FIGS. 8A and 8B are views showing the waveforms of the intermittent high-frequency outputs. Particularly, FIG. 8A shows the intermittent waveform of the high-frequency output, and FIG. 8B is an enlarged view of a part of FIG. 8A. As shown in FIGS. 8A and 8B, the waveform of the output power may fluctuate in the leading/trailing edge due to individual differences in the response property of the above-mentioned modulator, or due to individual differences between the parts. Accordingly, if the control is performed only through monitoring of the above-mentioned peak value, it is impossible to accurately calculate the real output value (the average value) in the above-mentioned method.

Incidentally, the fluctuation in the average output which is supplied to the load may give a large influence to the etching property given to wafers in the semiconductor finishing process. Further, even in the case where another high-frequency power supply with the same specification is used simultaneously, a difference is generated in the etching rate in the surface of the wafers, so that the process properties may fluctuate.

The invention has been achieved in consideration of such problems, and the present invention provides a high-frequency power supply for a plasma generation apparatus, in which the output accuracy in the intermittent high-frequency output can be improved.

In order to obviate these problems, the present invention adopts the following means.

A high-frequency power supply for a plasma generation apparatus provided with a modulator for generating an intermittent high-frequency output on the basis of a modulation reference signal and a peak value setting signal, the high-frequency power supply having: a first control loop including a peak value detector for detecting a peak value of the intermittent high-frequency output, and an output controller for comparing the peak value of the intermittent high-frequency output detected by the peak value detector with a preset peak value of the high-frequency output so that the output controller controls the peak value of the high-frequency output to be the preset peak value; and a second control loop including a monitor for detecting an average value of the intermittent high-frequency output, an arithmetic operation means for calculating an average value of the intermittent high-frequency output on the basis of the preset peak setting value and a preset duty ratio setting value, and a pulse generator for generating a modulation reference signal for controlling the modulator on the basis of the average value of the high-frequency output detected by the monitor and the average value of the high-frequency output calculated by the arithmetic operation means.

Other objects, features and advantages of the invention will become apparent from the following description of the embodiments of the invention taken in conjunction with the accompanying drawings

BRIEF DESCRIPTION OF THE DRAWINGS

FIG. 7 is a diagram showing a high-frequency power supply for a plasma generation apparatus in the background art.

DETAILED DESCRIPTION OF EMBODIMENTS

Referring to the attached drawings, embodiments of the present invention will be described hereunder.

Figure 1:
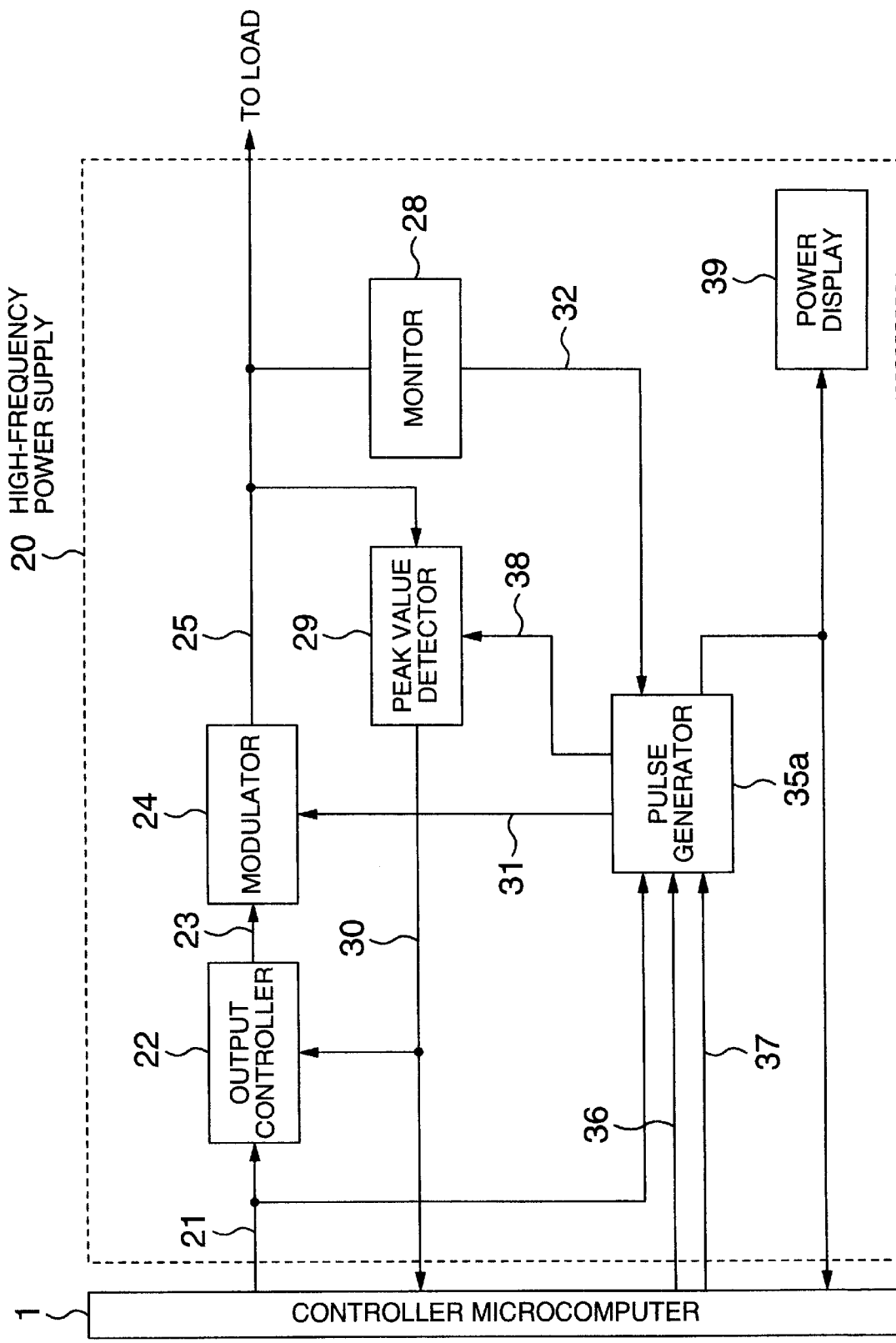
FIG. 1 is a diagram showing a high-frequency power supply for a plasma generation apparatus according to an embodiment of the present invention.

FIG. 1 is a diagram showing a high-frequency power supply for a plasma generation apparatus according to an embodiment of the present invention. In FIG. 1, there are provided a monitor 28 for detecting an average value of an intermittent high-frequency output, and a pulse generator 35a for generating a modulation reference signal 31 and a pulse reference signal 38 on the basis of a peak value setting signal 21, a repetition frequency setting signal 36 and an ON-time interval setting signal 37 which are supplied from a controller microcomputer 1. As will be described later, the pulse generator 35a generates a rectangular wave, with a predetermined duty ratio, on the basis of two average values. That is, one is an average value calculated based on the peak value setting signal, and a signal indicating a repetition frequency and an ON-time interval, and the other is an average value of the output monitored by the monitor. The pulse generator 35a generates the rectangular wave as the pulse reference signal 38. Further, the pulse generator 35a multiplies the pulse reference signal 38 by a high-frequency reference signal (oscillator output) to generate the modulation reference signal 31. In FIG. 1, there is further provided a display 39 for displaying the state of the high-frequency power supply.

In FIG. 1, the parts the same as or corresponding to those illustrated in FIG. 7 are denoted correspondingly, and the description of such parts will be omitted here.

Figure 2:
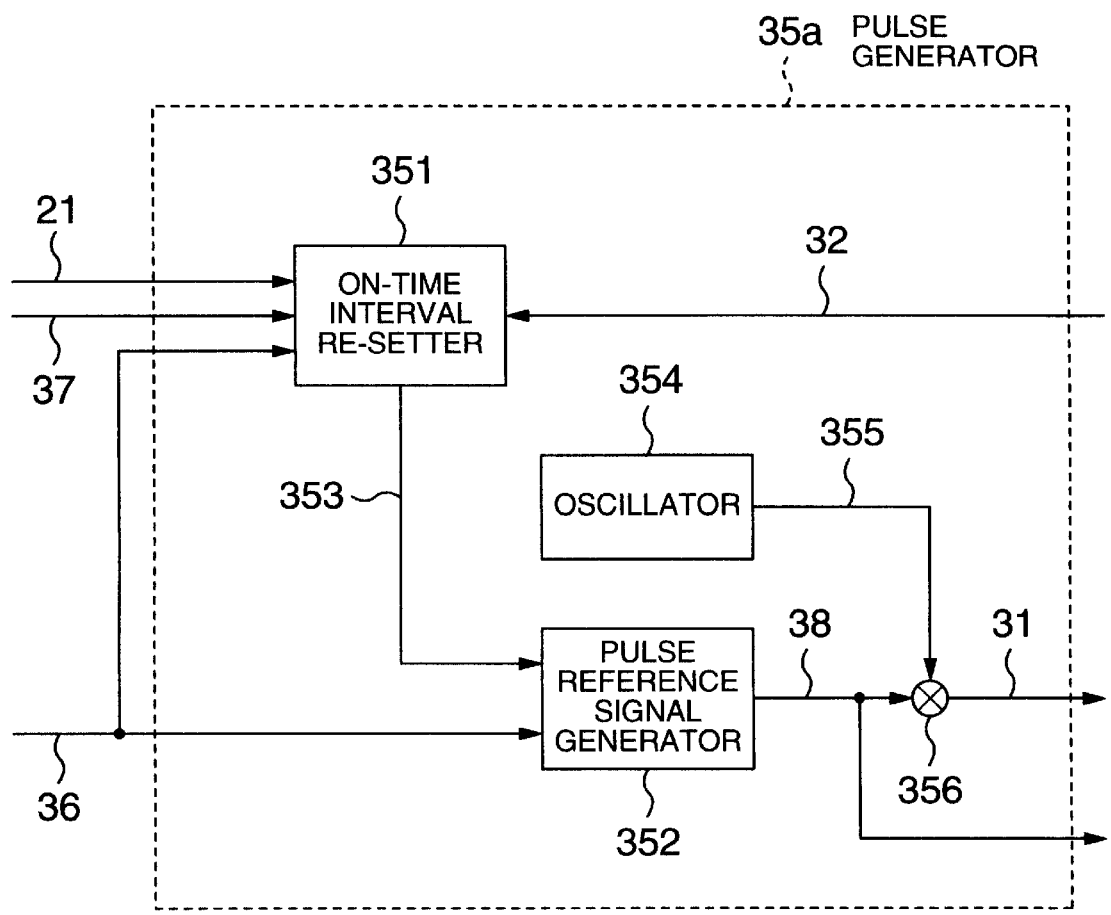
FIG. 2 is a diagram showing the details of a pulse generator.

FIG. 2 is a diagram showing the details of the pulse generator 35a. In FIG. 2, the pulse generator 35a includes an ON-time interval re-setter 351, a pulse reference signal generator 352, an oscillator 354, and a multiplier 356. The ON-time interval re-setter 351 calculates an average output on the basis of the peak value setting signal 21, the ON-time interval setting signal 37 and the frequency setting signal 36, resets the ON-time interval on the basis of the calculated average output and an average output 34 measured by the monitor 28, and generates an ON-time interval resetting signal 353. The pulse reference signal generator 352 generates the pulse reference signal 38 on the basis of the ON-time interval resetting signal 353 and the repetition frequency setting signal 36. The oscillator 354 oscillates a high-frequency reference signal 355 (for example 400 kHz) functioning as a reference of the frequency of the electric power to be supplied to a load. The multiplier 356 multiplies the high-frequency reference signal 355 by the pulse reference signal 38 to generate the modulation reference signal 31.

Next, the ON-time interval re-setter 351 will be described in detail. First, the ON-time interval re-setter 351 calculates the average output to be outputted from the peak value setting signal 21, the repetition frequency setting signal 36, and the ON-time interval setting signal 37. For example, assuming now that the set value of the peak value setting signal 21 is 200 W, and the set value of the duty ratio set based on the repetition frequency setting signal 36 and the ON-time interval setting signal 37 is 20% (ON-time ratio), the ON-time interval re-setter 351 calculates an output set value so that the average output value is 40 W. Incidentally, in place of the ON-time interval setting signal 37, a signal indicating the duty ratio may be inputted. In this case, the repetition frequency setting signal 36 is not necessary.

Next, the ON-time interval re-setter 351 compares the calculated output value and the average output value measured by the monitor with each other, and sets the ON-time interval again on the basis of the result of comparison, so that the ON-time interval re-setter 351 generates the ON-time interval resetting value 353. For example, in the case where the value of the average output 34 measured in the monitor is larger than the time average output signal 40 W which is made to be the reference value, the ON-time interval re-setter 351 judges that the average output outputted from the high-frequency power supply is large, and outputs the ON-time interval resetting signal 353 having the ON-time interval set already, so that the ON-time interval re-setter 351 shortens the time interval in the ON-time interval resetting signal 353 to thereby reduce the average output value. On the other hand, in the case where the value of the average output 34 measured in the monitor is smaller than the time average output signal 40 W which is made to be the reference value, the ON-time interval re-setter 351 judges that the average output outputted from the high-frequency power supply is small, and outputs the ON-time interval resetting signal 353 having the ON-time interval set already, so that the ON-time interval re-setter 351 elongates the ON-time interval in the ON-time interval setting signal 353 to thereby increase the average output value.

The pulse reference signal generator 352 generates the pulse reference signal 38 on the basis of the resetting signal 353 and the frequency setting signal 36. The pulse reference signal generator 352 multiplies the pulse reference signal 38 by the high-frequency reference signal 355 through the multiplier 356 to thereby generates the modulation reference signal 31.

Figure 3A:
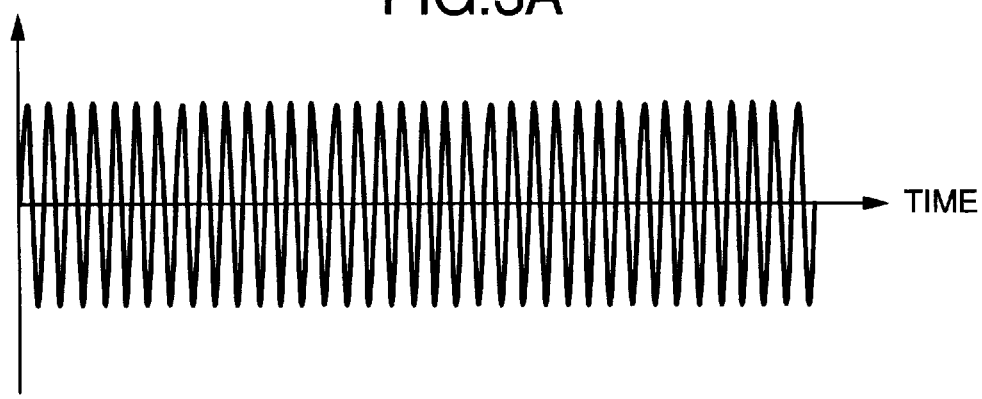
FIGS. 3A, 3B and 3C are views showing the waveforms at respective portions of the pulse generator.
Figure 3B:
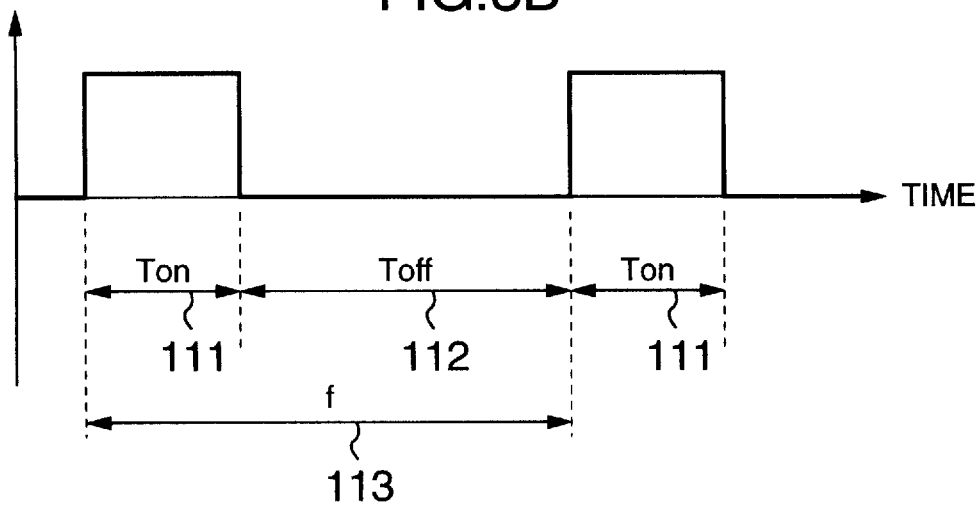
Figure 3C:
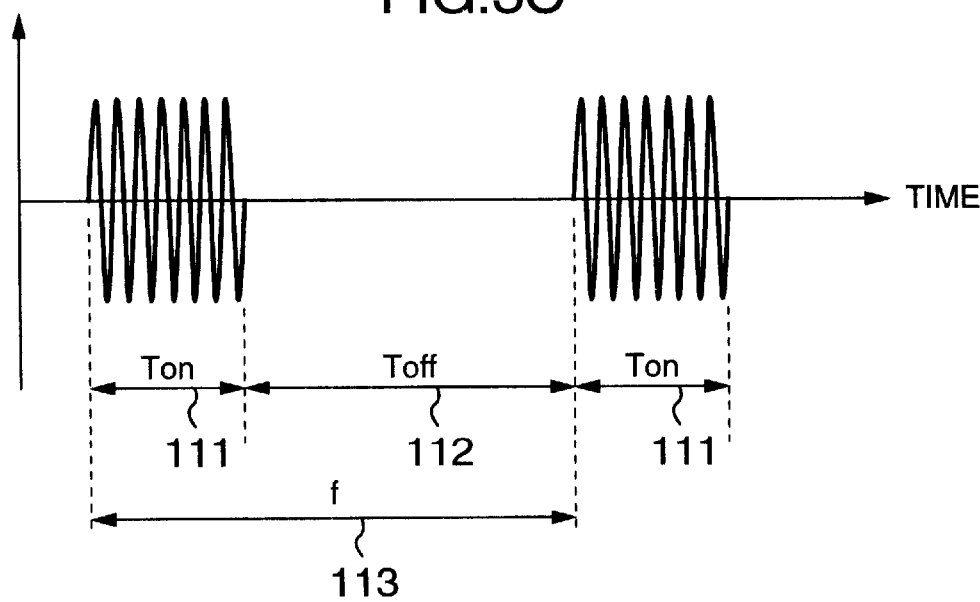

FIGS. 3A to 3C are views showing the respective waveforms at portions of the pulse generator 35a. FIG. 3A shows the waveform of the high-frequency reference signal 355, FIG. 3B shows the waveform of the pulse reference signal 38, and FIG. 3C shows the waveform of the modulation reference signal 31. In the drawings, the reference numeral 111 denotes the ON-period of the pulse reference signal 38 and the modulation reference signal 31; the reference numeral 112 denotes the OFF-period of the pulse reference signal 38 and the modulation reference signal 31; and the reference numeral 113 denotes the frequency (period) of the repetition frequency setting signal 36.

Figure 4:
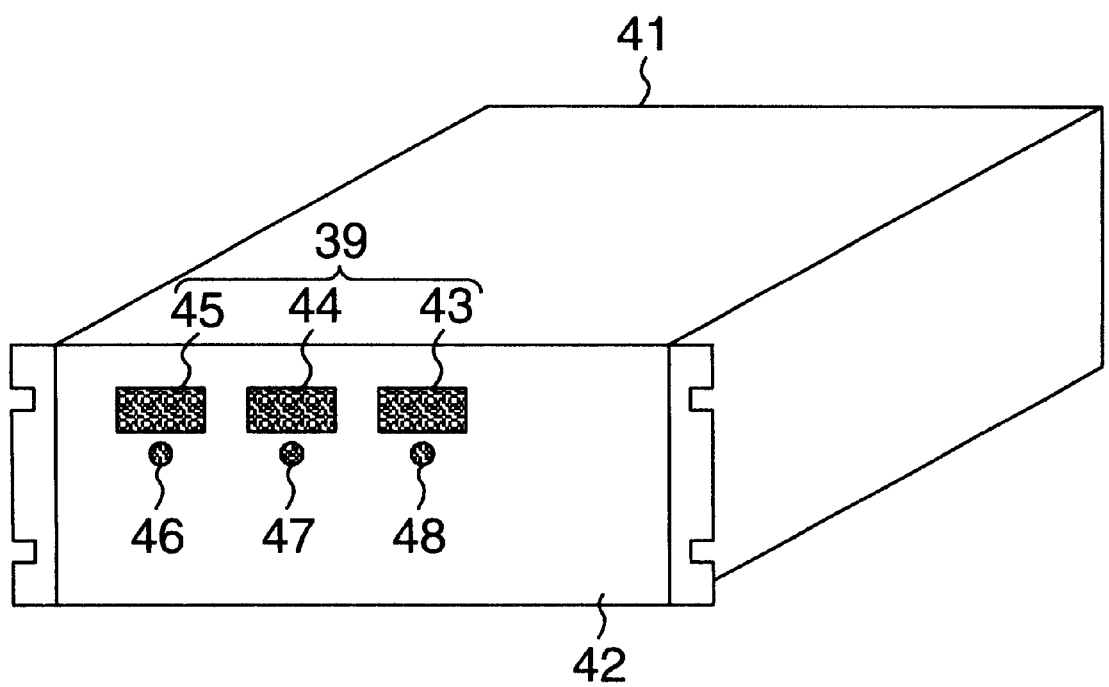
FIG. 4 is a perspective view showing the high-frequency power supply provided with displays.

FIG. 4 is a view showing an example of the high-frequency power supply 20 provided with the display 39. In FIG. 4, a case 41 receives a body of a high-frequency power supply. A panel 42 is provided on the front side of the case 41, and has displays 43, 44 and 45 provided on the panel 42 for displaying the above-mentioned duty ratio, repetition frequency, peak value setting signal, average output measured by the monitor, etc. The panel 42 further has setting buttons 46, 47 and 48 provided thereon for setting/inputting the duty ratio, the repetition frequency, the peak value setting signal, etc. Further, the deviation between the average output and the instruction value of the output which is set by any one of the duty ratio, the repetition frequency, the peak value setting signal, etc., can be displayed, and an alarm can be given upon the deviation. Further, since the setting buttons are provided, the user can perform various kinds of setting without going to the place where the microcomputer is installed.

Next, the operation of the high-frequency power supply shown in FIG. 1 will be described hereunder. As shown in FIG. 1, the high-frequency power supply according to an embodiment of the present invention is provided with a first control loop and a second control loop. The first control loop is a feedback loop for controlling the peak value of the output of the high-frequency power supply (including the output controller 22, the modulator 24, and the peak value detector 29), while the second control loop is another feedback loop for controlling the average output of the output of the high-frequency power supply (including the modulator 24, the monitor 28 and the pulse generator 35a).

First, the first control loop will be described. A peak value setting signal 21 is set by the controller microcomputer 1. The output controller 22 outputs the peak value operation signal 23 on the basis of the peak value setting signal 21 and the peak value signal 30 detected by the peak value detector 29. The modulator 24 multiplies the operation signal 23 by the modulation reference signal (including the fundamental frequency component of the output of the high-frequency power supply and the pulse reference signal component which repeats ON/OFF in the form of a pulse at a predetermined duty ratio) which is generated in the pulse generator 35a as shown in FIG. 3C. The modulator 24 then modulates and amplifies the product so as to supply the amplified output to a not-shown load. The peak value detector 29 detects the amplified output, that is, the intermittent high-frequency output, and feeds back the detected peak value signal to the output controller 22. Further, at this time, the peak value detector 29 may also supply the detected peak value signal to the controller microcomputer 1, so as to make the controller microcomputer 1 capable of collecting data.

Next, the second control loop will be described. The monitor 28 monitors the time average value of the intermittent high-frequency output 25. As the method of monitoring, for example, a thermocouple system has been known in which, like a thermocouple, a high-frequency output is converted into thermal electromotive force and then the thermal electromotive force is detected. The monitor output 32 (the time average value of the intermittent high-frequency output 25) of the monitor 28 is fed back to the pulse generator 35a and to the controller microcomputer 1. At this time, the monitor output 32 may be displayed on the display 39.

Although, in this embodiment, the monitor output 32 is arranged to be applied to the controller microcomputer 1 and the display 39 through the pulse generator 35a, the monitor output 32 may be arranged to be directly applied to the controller microcomputer 1 and the display 39 without passing through the pulse generator 35a.

Figure 5:
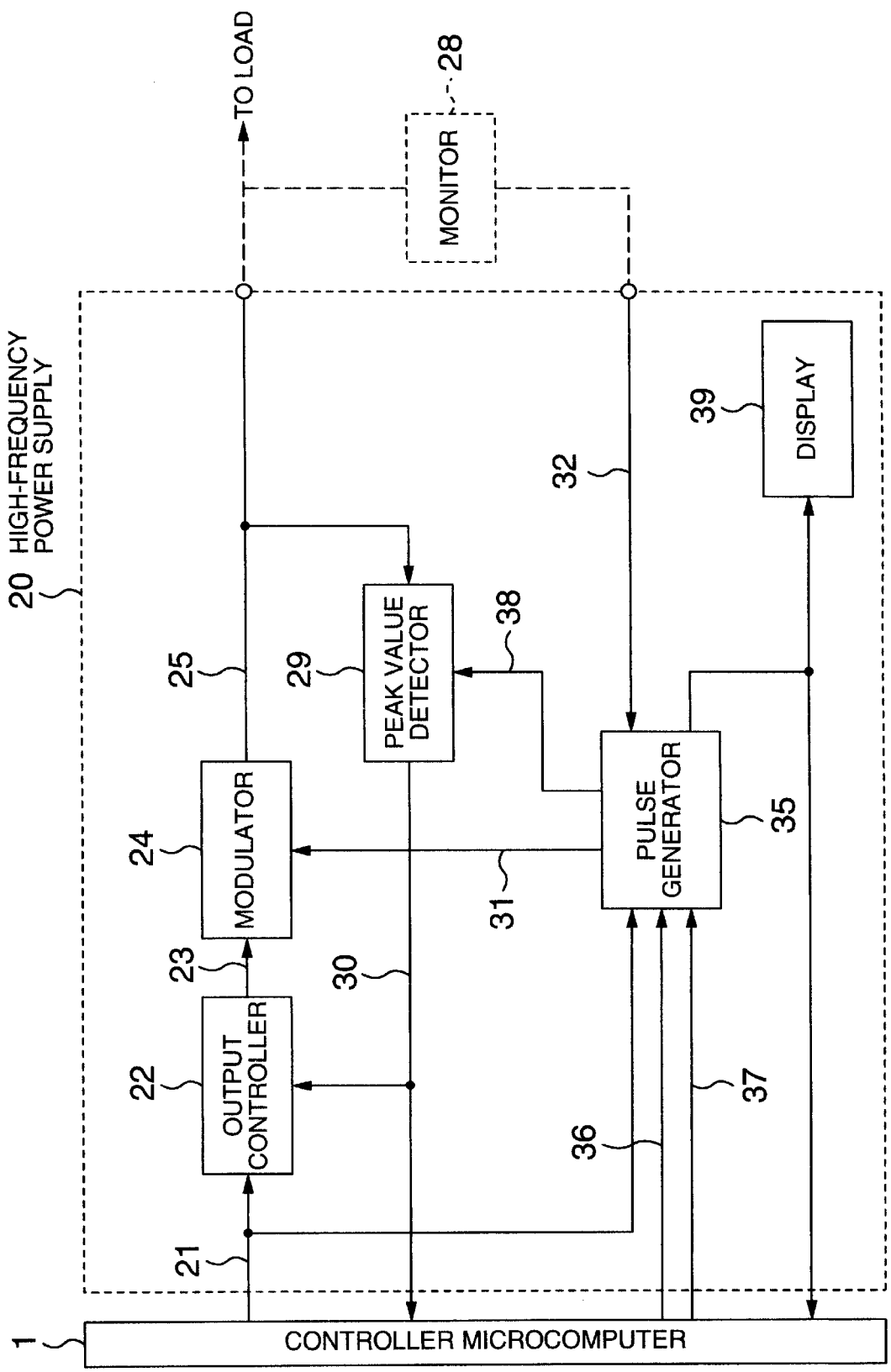
FIG. 5 is a diagram showing another embodiment of the high-frequency power supply.
Figure 6:
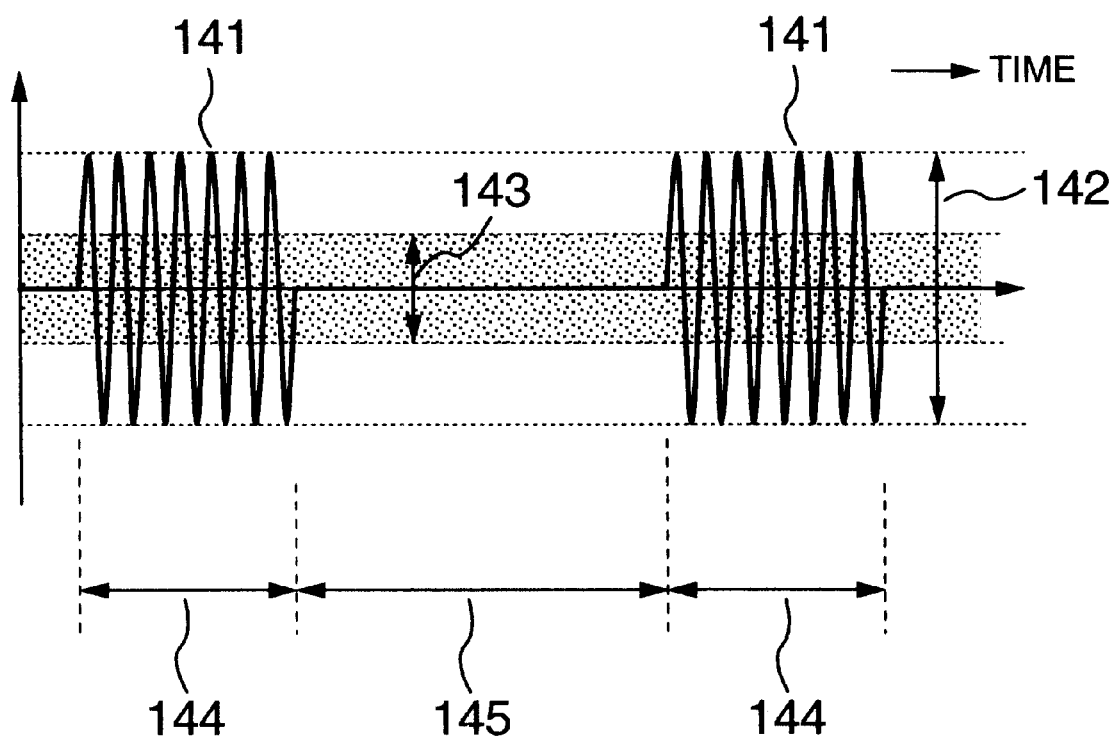
FIG. 6 is a view showing the relationship between the average output and the peak output.
Figure 8A:
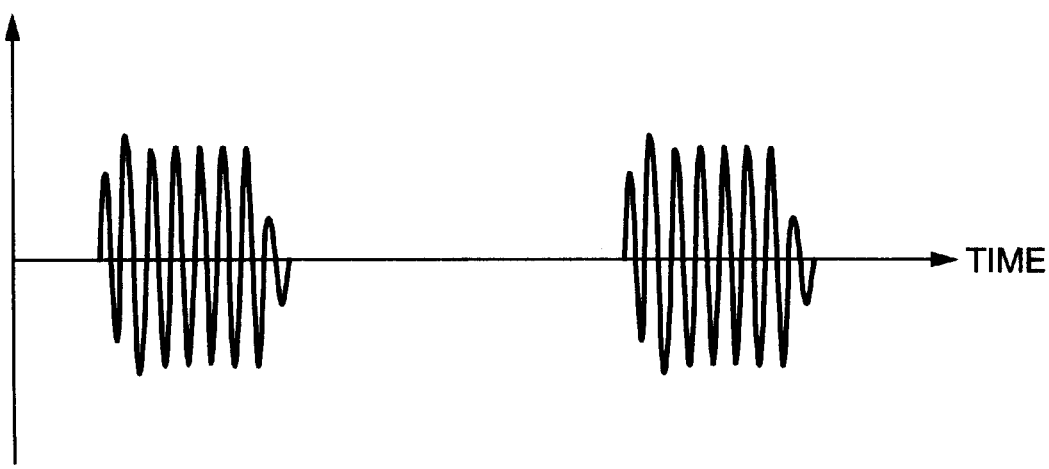
FIGS. 8A and 8B are views showing output waveforms of an intermittent high-frequency output.
Figure 8B:
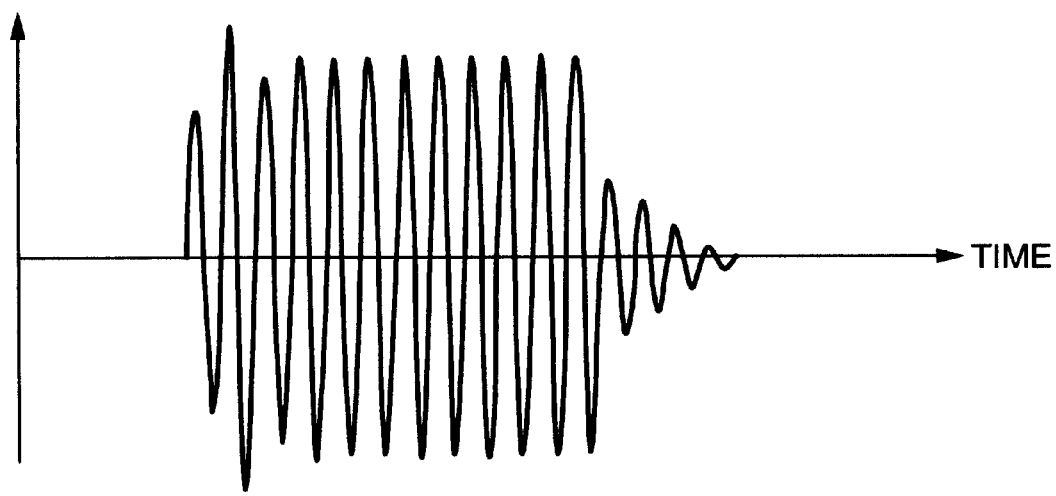

FIG. 5 is a view showing another example of the high-frequency power supply 20. In this example, the monitor (28 in FIG. 1) may be provided outside the high-frequency power supply 20. That is, the monitor which is difficult to be small-sized is provided separately from the high-frequency power supply 20. Thus, the high-frequency power supply can be made small in size and light in weight.

As described above, the high-frequency power supply according to this embodiment includes a second control loop which is a feedback loop (modulator 24, monitor 28, pulse generator 35a) for controlling the average output of the high-frequency power supply output so that the duty ratio of the high-frequency power supply output is controlled while the average value of the intermittent high-frequency output is monitored. Accordingly, even in the case where, for example, among the apparatuses 20 there appears a difference in the leading or trailing edge of waveform due to individual differences in the response property of the modulator or due to individual differences between the parts, it is possible to obtain a high-frequency power supply output having a desired output value in each of the apparatuses 20. Accordingly, by use of this power supply having the feedback loop, influences given to the semiconductor finishing process can be reduced since variance of the outputs among the respective power supplies is absorbed. For example, the variations in etching characteristics given to wafers can be reduced so that it is possible to finish homogeneous wafers. Further, by provision of the first feedback loop, it is possible to obtain the average value of the high-frequency output having less variations.

Further, the controller microcomputer 1 may output selected one of a plurality of setting signals (for example, first and second setting signals) as the peak value setting signal 21. In this case, the modulator may be designed as follows. For example, the modulator produces a high-frequency output with an amplitude indicated by the first setting signal in the ON-period of the modulation reference signal, while the modulator produces a high-frequency output with an amplitude indicated by the second setting signal in the OFF-period of the modulation reference signal. In this case, in place of the intermittent high frequency output, the high frequency output has a difference in amplitude due to the difference between the amplitude values indicated by the first and second setting signals. For example, in the case where the first and second setting signals are set to be high and low potentials respectively, control may be performed as follows. For example, the ON-period is increased when the output decreases, while the ON-period is decreased when the output increases.

As described above, the present invention can provide a high-frequency power supply for a plasma generation apparatus in which the output accuracy in the intermittent high-frequency output can be improved.

It should be further understood by those skilled in the art that the foregoing description has been made on embodiments of the invention and that various changes and modifications may be made in the invention without departing from the spirit of the invention and the scope of the appended claims.

What is claimed is:

1. A high-frequency power supply apparatus for a plasma generation apparatus having a modulator for generating an intermittent high-frequency output on the basis of a modulation reference signal and a peak value setting signal, said high-frequency power supply apparatus comprising:

a first control loop including a peak value detector for detecting a peak value of said intermittent high-frequency output, and an output controller for comparing the peak value of said intermittent high-frequency output detected by said peak value detector with a preset peak value of said high-frequency output so that said output controller controls the peak value of said high-frequency output to be said preset peak value; and a second control loop including a monitor for detecting an average value of said intermittent high-frequency output, an arithmetic operation means for calculating an average value of said intermittent high-frequency output on the basis of the preset peak setting value and a preset duty ratio setting value, and a pulse generator for generating a modulation reference signal for controlling said modulator on the basis of the average value of said high-frequency output detected by said monitor and the average value of said high-frequency output calculated by said arithmetic operation means.

2. The high-frequency power supply apparatus for a plasma generation apparatus according to claim 1, wherein said pulse generator includes a display for displaying at least the average value of said high-frequency output detected by said monitor and the average value of said high-frequency output calculated by said arithmetic operation means.

3. The high-frequency power supply apparatus for a plasma generation apparatus according to claim 1, further comprising setting change-over means for changing-over setting of said peak value setting signal.

4. The high-frequency power supply apparatus for a plasma generation apparatus according to claim 2, wherein said pulse generator includes a display for displaying at least the average value of said high-frequency output detected by said monitor and the average value of said high-frequency output calculated by said arithmetic operation means.

5. The thigh-frequency power supply apparatus for a plasma generation apparatus according to claim 1, wherein said output monitor includes a monitor of a thermocouple system.

6. The high-frequency power supply apparatus for a plasma generation apparatus according to claim 3, wherein said output monitor includes a monitor of a thermocouple system.

7. A high-frequency power supply apparatus for a plasma generation apparatus according to claim 3, wherein said pulse generator includes a display for displaying at least the average value of said high-frequency output detected by said monitor and the average value of said high-frequency output calculated by said arithmetic operation means.

8. A high-frequency power supply apparatus for a plasma generation apparatus having a modulator for generating intermittent high-frequency output on the basis of a modulation reference signal, said high-frequency power supply apparatus comprising:

a monitor for detecting an average value of said intermittent high-frequency output; and an arithmetic operation means for calculating an average value of said intermittent high-frequency output on the basis of a peak value setting signal and a duty ratio setting signal for said high-frequency output;

wherein said modulator is controlled on the basis of the average value of said high-frequency output detected by said monitor and the average value of said high-frequency output calculated by said arithmetic operation means.

* * * * *